United States Patent
Piccardi

(10) Patent No.: US 11,100,977 B2
(45) Date of Patent: *Aug. 24, 2021

(54) SYSTEMS AND METHODS FOR PERFORMING DYNAMIC ON-CHIP CALIBRATION OF MEMORY CONTROL SIGNALS

(71) Applicant: Micron Technology, Inc., Boise, ID (US)

(72) Inventor: Michele Piccardi, Cupertino, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/098,220

(22) Filed: Nov. 13, 2020

(65) Prior Publication Data

US 2021/0065777 A1    Mar. 4, 2021

Related U.S. Application Data

(63) Continuation of application No. 16/445,746, filed on Jun. 19, 2019, now Pat. No. 10,878,882.

(51) Int. Cl.

| | |
|---|---|
| *G11C 16/08* | (2006.01) |
| *G11C 11/408* | (2006.01) |
| *G11C 16/26* | (2006.01) |
| *G11C 11/4074* | (2006.01) |
| *G11C 16/34* | (2006.01) |

(52) U.S. Cl.
CPC ...... *G11C 11/4085* (2013.01); *G11C 11/4074* (2013.01); *G11C 16/08* (2013.01); *G11C 16/26* (2013.01); *G11C 16/3459* (2013.01)

(58) Field of Classification Search
CPC . G11C 11/4085; G11C 16/3459; G11C 16/26; G11C 16/08; G11C 11/4074; G11C 2029/1202; G11C 29/021; G11C 29/028; G11C 5/145; G11C 16/3418; G11C 16/32; G11C 16/30; G11C 16/0483; G11C 8/08
See application file for complete search history.

(56) References Cited

U.S. PATENT DOCUMENTS

| | | |
|---|---|---|
| 10,878,882 B1 | 12/2020 | Piccardi |
| 2020/0402564 A1 | 12/2020 | Piccardi |

OTHER PUBLICATIONS

Systems and Methods for Performing Dynamic On-Chip Calibration of Memory Control Signals, U.S. Appl. No. 16/445,746, filed Jun. 19, 2019, Michele Piccardi, Publications—Issue Fee Payment Verified, Oct. 13, 2020.

*Primary Examiner* — Jay W. Radke
(74) *Attorney, Agent, or Firm* — Greenberg Traurig

(57) ABSTRACT

Systems and methods of dynamically calibrating memory control signals during increase of wordline voltage for memory technologies subject to charge loss are disclosed. In one aspect, an exemplary method may comprise using an internal node, such as a wordline regulator output or return feedback line or a replica of the wordline, as proxy for the local wordline voltage. In one or more further embodiments, the proxy signal may be converted to digital signal or code and even determined in the background before the signal is needed for calibration. As a function of the disclosed technology, calibration of memory control signals, such as pass voltage and wordline read-verify voltage, may be performed during increase of the wordlines voltage with no impact or penalty on read/program time.

29 Claims, 10 Drawing Sheets

SYSTEMS AND METHODS FOR PERFORMING DYNAMIC ON-CHIP CALIBRATION OF MEMORY CONTROL SIGNALS

RELATED APPLICATIONS

The present application is a continuation application of U.S. patent application Ser. No. 16/445,746, filed Jun. 19, 2019, and entitled "Systems and Methods for Performing Dynamic On-Chip Calibration of Memory Control Signals", the entire disclosure of which is hereby incorporated herein by reference.

TECHNICAL FIELD

The present disclosure relates generally to multi-level flash memory control, and more particularly, to on-chip systems and methods for performing improved calibration of memory control signals.

BACKGROUND

Various modern semiconductor memory, such as three-dimensional NAND flash memory, may suffer from early retention (i.e., fast charge loss exponential with time from the programming event) in a lateral direction due to the shared charge trap layer. FIGS. 1A-1B are diagrams illustrating a three-dimensional NAND flash memory known in the art. As shown in FIG. 1A, the three-dimensional NAND flash memory structure 100 may comprise, extending outward from a core, a polysilicon channel layer 105, a tunnel oxide layer 110 around the polysilicon layer 105, a charge trapping layer 115 such as a silicon nitride layer of an O/N/O stack associated with the tunnel oxide layer 110, a block oxide layer 120 around the stack layer 115, and gate electrode structures 125 on top of the block oxide layer 120. The charge trapping layer 115 is shared between wordlines (WLs) in such three-dimensional memory structures 100, as known in the art. FIG. 1B is an exploded view of the cross section illustrated in the three-dimensional NAND flash memory of FIG. 1A, as known in the art. FIG. 1B illustrates a collection of electrons underneath a select cell 125A in the charge trapping layer 115. After programming operation, e.g., movement of electrons along the gates shown as 135, electrons are trapped in the charge trap layer below the selected gate 125A, as shown at 130. However, due to the charge trapping layer being shared across the various cells 125, fast charge loss (i.e., "short retention" when charge is retained for only a short time, referred to as "early retention") can occur in the lateral direction, as shown at 140.

FIG. 2A is a graph 246 depicting the known effects of early retention on a representative waveform reflecting read voltage along the X axis, mapped versus string current along the Y axis. A first waveform 248 in a first position on the right side of FIG. 2A illustrates ideal or target read voltage ($V_T$) and string current ($I_{string}$) conditions right after programming. However, within a few seconds, due, in part, to such early retention and its effect on $V_T$ and string current, losses due to this lateral dissipation of electrons will reduce the read voltage ($V_T$) needed to achieve the previous string current, thereby shifting the voltage waveform to the second, lower-voltage position 220 shown on the left in FIG. 2A. As such, the same target string current is generated with a different read voltage (lower) than initially intended, potentially making it difficult to read back the data after programming, e.g., if some sort of calibration is not provided.

FIG. 2B is a graph 250 depicting a series of ideal $V_T$ distribution waveforms shown against one adjusted waveform demonstrating the effects of early retention (fast charge loss), as known in the art. Graph 250 shows a series of even-distribution waveforms 256 that exhibit target or ideal $V_T$ voltage characteristics right after programming as well as an adjusted (altered) $V_T$ waveform 262 shifted to the left and down on the X axis and the Y axis, respectively. As can be seen, such early retention threatens the multi-level cell capability and the tight $V_T$ distribution, and can lead to significant shift 262 of the distribution such that verification fail occurs, e.g., at 270. Potentially, read operation after a given time from programming event might also incur failure due to this effect, if a calibration mechanism is not provided.

In particular, detection of L7 for TLC (triple-level cell) and L15 for QLC (quad-level cell) flash memory is used for calibration of pass voltage, e.g. to limit read disturbs, and for coarse calibration of wordline read-verify voltage. Accordingly, especially given the critical need for L7 and L15 level detection, dynamic calibration that accurately corrects for losses such as losses due to fast charge loss/early retention is important to increase success of soft bit information techniques and avoid read retry attempts.

The disclosed technology remedies these and/or other deficiencies of existing memory (read) control and/or write training presently used for such memories.

BRIEF DESCRIPTION OF THE DRAWINGS

The foregoing and other objects, features, and advantages of the disclosure will be apparent from the following description of embodiments as illustrated in the accompanying drawings, in which reference characters refer to the same parts throughout the various views. The drawings are not necessarily to scale, emphasis instead being placed upon illustrating principles of the disclosure.

DETAILED DESCRIPTION

The following disclosure describes various embodiments of systems and methods of calibrating memory (read) control signals dynamically, such as during increase of wordline voltage. According to one embodiment, an exemplary method may comprise using an internal node, such as a wordline regulator output or return feedback line or a replica of the wordline, as proxy for the local wordline voltage. In one or more further embodiments, the proxy signal may be converted to digital code, and even determined in the background before the signal is needed for calibration. As a function of the disclosed technology, calibration of read control signals, such as pass voltage and wordline read-verify voltage, may be performed during increase of the wordline voltage with no impact or penalty on read/program times. Accordingly, systems and methods consistent with the disclosed technology may avoid performance penalty while being able to dynamically calibrate memory control signals, even for NAND memory cells demonstrating fast charge loss (early retention) effect, as typical of the charge trap structures found in 3-D flash memory, for example.

Various innovations herein may include and/or involve one or more aspects associated with the source current roll-off detection scheme(s) set forth in application Ser. No. 16/424,448, filed May 28, 2019, issued as U.S. Pat. No. 10,741,260 on Aug. 11, 2020, which is incorporated herein by reference.

Figures 1A, 1B:
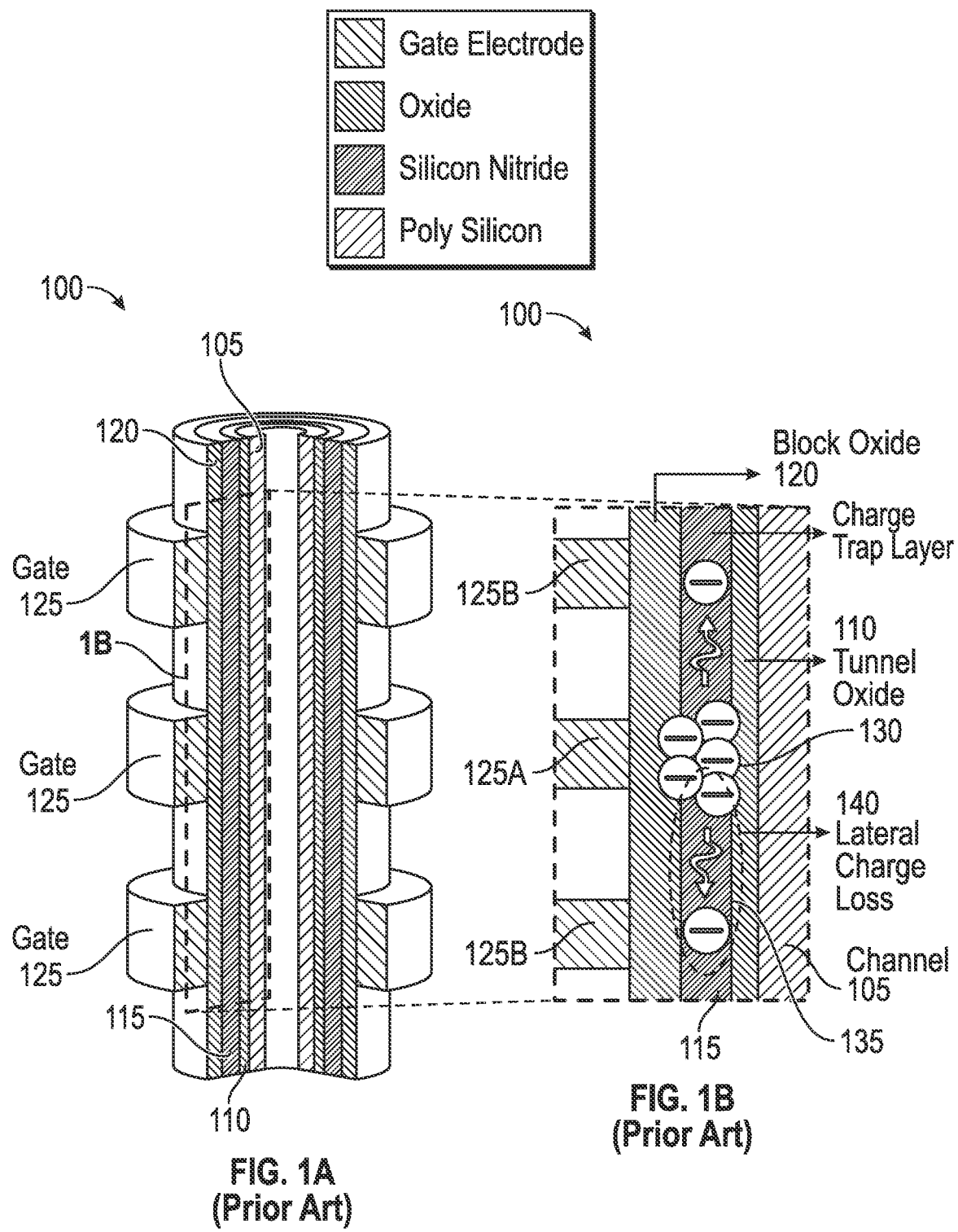
FIG. 1A is a diagram illustrating a three-dimensional NAND flash memory known in the art.
FIG. 1B is an exploded view of the cross section illustrated in the three-dimensional NAND flash memory of FIG. 1A, as known in the art.
Figure 2A:
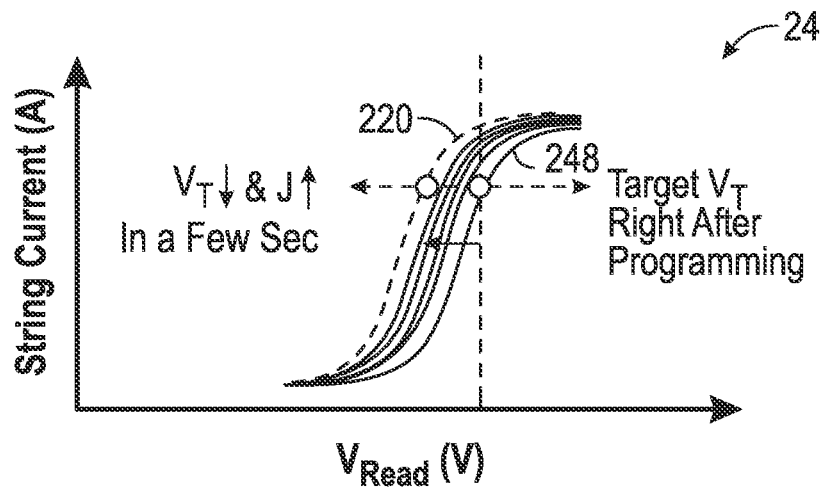
FIG. 2A is a graph depicting the effects of early retention (fast charge loss) on a representative waveform of read voltage versus string current, as known in the art.
Figure 2B:
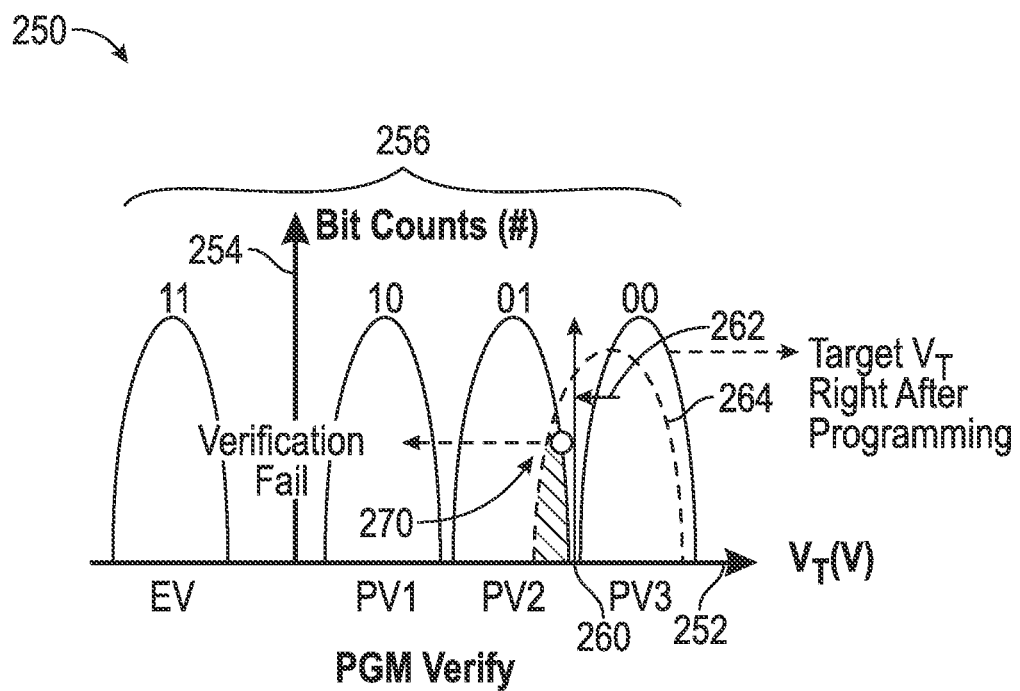
FIG. 2B is a graph depicting a series of ideal $V_T$ distribution waveforms shown against an adjusted $V_T$ waveform modified by the effects of early retention (fast charge loss), as known in the art.
Figure 3A:
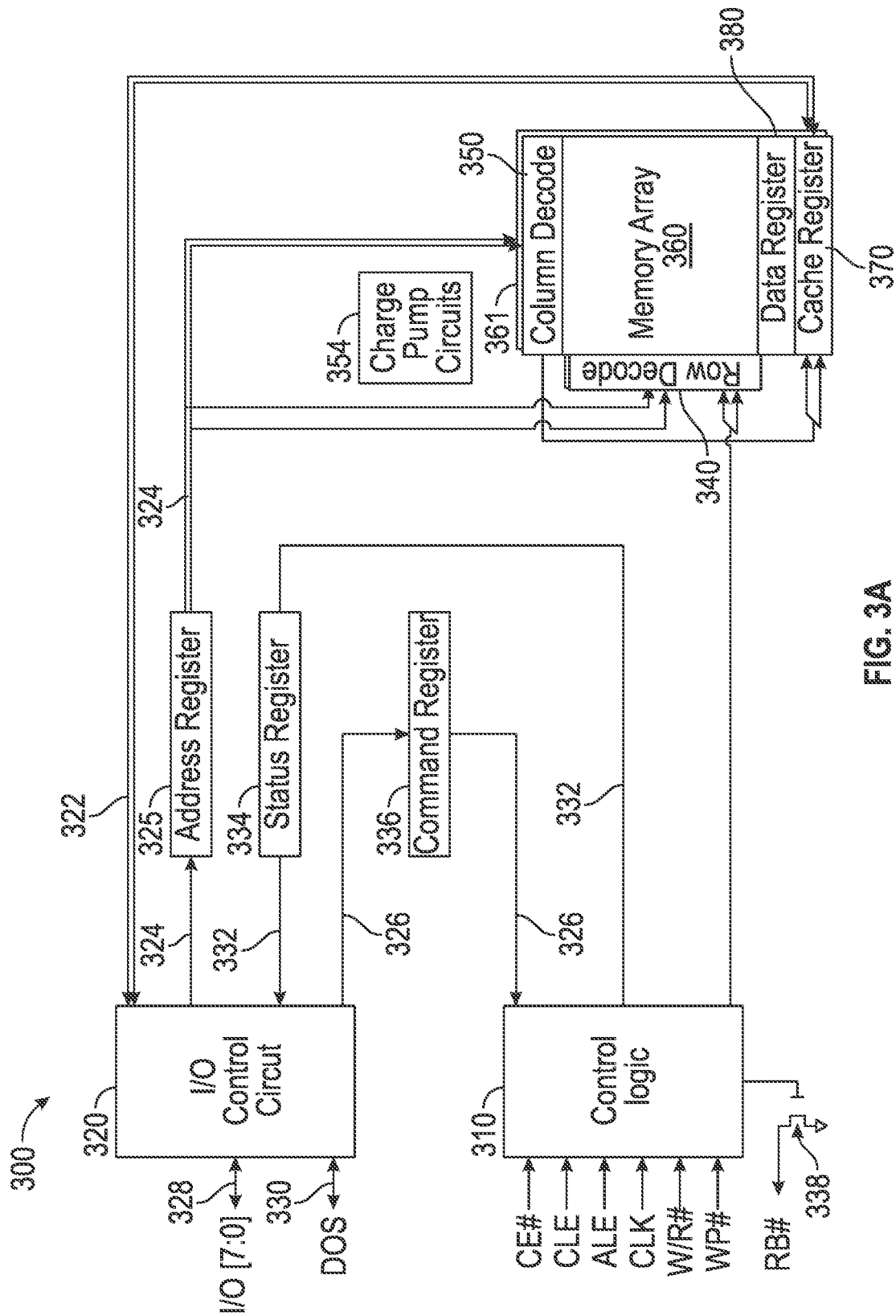
FIGS. 3A-3D are diagrams of memory circuitry associated with a memory array according to embodiments of the disclosed technology.

FIG. 3A is a block diagram of memory circuitry 300 associated with a memory array according to embodiments of the disclosed technology. The memory circuitry 300 includes a memory array 360, which may be multiple arrays, e.g., array 361, etc., with a plurality of memory cells that are configured to store data. The memory cells may be accessed in the array through the use of various signal lines, for example, global word lines (GWLs), local word lines (LWLs), and bitlines (BLs). The memory cells may be non-volatile memory cells, such as NAND flash cells, though may be another type of memory cells. The memory cells may be single level cells configured to store data for one bit of data. The memory cells may also be multi-level cells configured to store data for more than one bit of data.

Commands, address information, and write data may be provided to the memory 300 as sets of sequential input/output (I/O) transmitted through an I/O bus 328. Similarly, read data may be provided from the memory 300 through the I/O bus 328. A data strobe signal DQS may be transmitted through a data strobe bus 330. The DQS signal may be used to provide timing information for the transfer of data to the memory or from the memory. The I/O bus 328 is connected to an I/O control circuit 320 that routes data signals, address information signals, and other signals between the I/O bus 328 and an internal data bus 322, an internal address bus 324, and an internal command bus 326. An address register 325 may be provided address information by the I/O control circuit 320 to be temporarily stored. The I/O control circuit 320 is coupled to a status register 334 through a status register bus 332. Status bits stored by the status register 334 may be provided by the I/O control circuit 320 responsive to a read status command provided to the memory 300. The status bits may have respective values to indicate a status condition of various aspects of the memory and its operation.

The memory 300 also includes a control logic 310 that receives a number of control signals either externally (e.g., CE #, CLE, ALE, CLK, W/R #, and WP #) or through the command bus 326 to control the operation of the memory 300. A command register 336 is coupled to the internal command bus 326 to store information received by the I/O control circuit 320 and provide the information to the control logic 310. The control logic 310 may further access a status register 334 through the status register bus 332, for example, to update the status bits as status conditions change. The control logic 310 is further coupled to a ready/busy circuit 338 to control a value (e.g., logic value) of a ready/busy signal R/B # that may be provided by the memory 300 to indicate whether the memory is ready for an operation or is busy. The control logic 310 may be configured to provide internal control signals to various circuits of the memory 300. For example, responsive to receiving a memory access command (e.g., read, write, program), the control logic 310 may provide internal control signals to control various memory access circuits to perform a memory access operation. The various memory access circuits are used during the memory access operation, and may generally include circuits such as row and column decoders, charge pump circuits, signal line drivers, data and cache registers, I/O circuits, as well as others.

The address register 325 provides block-row address signals to a row decoder 340 and column address signals to a column decoder 350. The row decoder 340 and column decoder 350 may be used to select blocks of memory cells for memory operations, for example, read, program, and erase operations. The row decoder 340 and/or the column decoder 350 may include one or more signal line drivers configured to provide a biasing signal to one or more of the signal lines in the memory array 360. The signal line drivers may drive the signal lines with a pumped voltage that is provided by charge pump circuits 354. The charge pump circuits 354 may provide different voltages used during operation of the memory 300, for example, during memory access operations. The voltages provided by the charge pump circuits 354 may include voltages that are greater than a power supply voltage provided to the memory 300, voltages that are less than a reference voltage (e.g., ground) provided to the memory 300, and/or other voltages, as well.

Figure 3B:
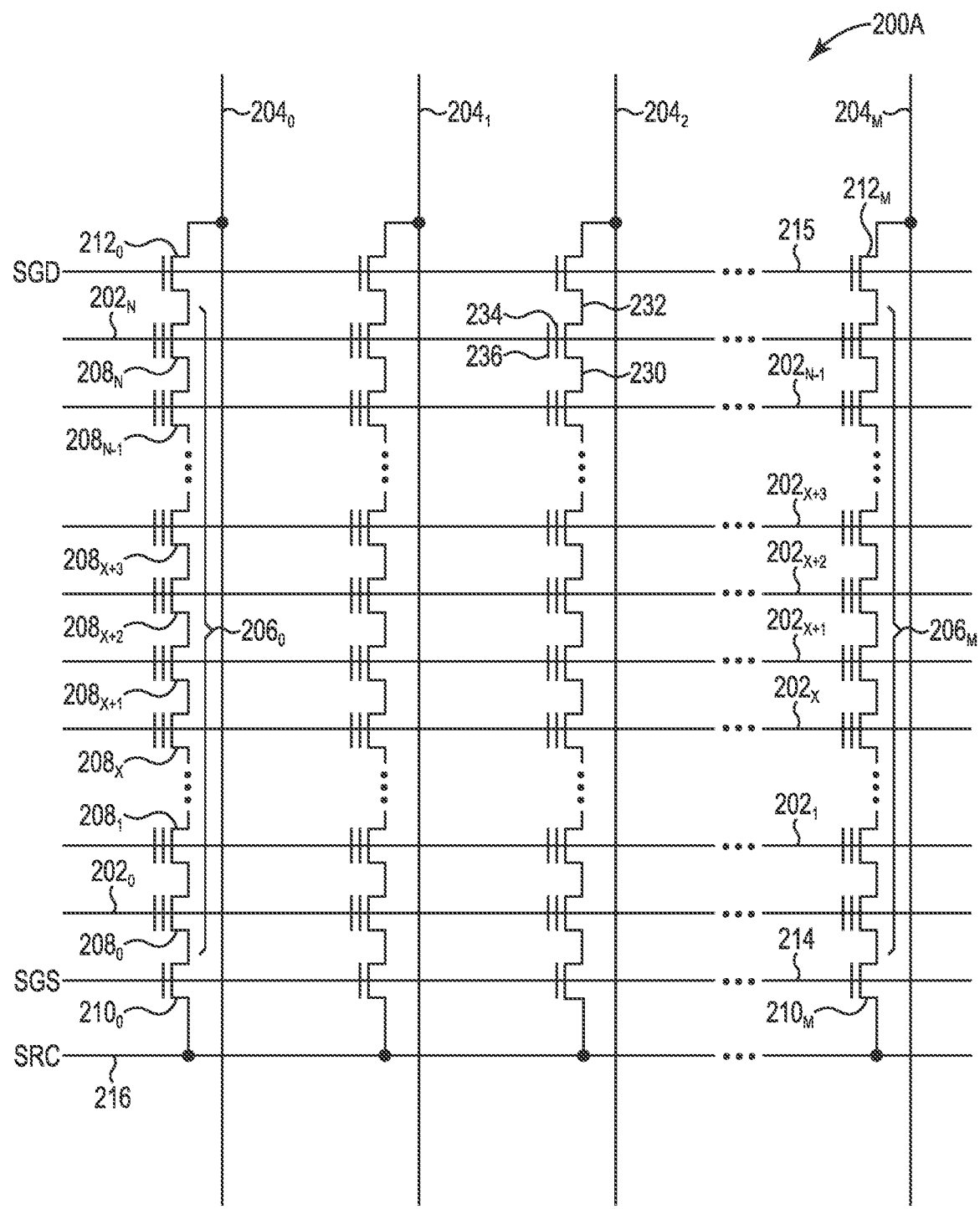

FIG. 3B is a schematic of a memory array 200A, such as a NAND memory array, e.g., as a portion of array of memory array 360 of FIG. 3A. Memory array 200A includes access lines, such as word lines $202_0$ to $202_N$, and data lines, such as bit lines $204_0$ to $204_M$. The word lines 202 may be coupled to global access lines (e.g., global word lines), not shown in FIG. 3B, in a many-to-one relationship. For some embodiments, memory array 200A may be formed over a semiconductor that, for example, may be conductively doped to have a conductivity type, such as a p-type conductivity, e.g., to form a p-well, or an n-type conductivity, e.g., to form an n-well.

Memory array 200A might be arranged in rows (each corresponding to a word line 202) and columns (each corresponding to a bit line 204). Each column may include a string of series-coupled memory cells, such as one of NAND strings $206_0$ to $206_M$. Each NAND string 206 might be coupled to a common source 216 and might include memory cells $208_0$ to $208_N$. The memory cells 208 represent non-volatile memory cells for storage of data. The memory cells 208 of each NAND string 206 might be connected in series between a select transistor 210 (e.g., a field-effect transistor), such as one of the select transistors $210_0$ to $210_M$ (e.g., that may be source select transistors, commonly referred to as select gate source), and a select transistor 212 (e.g., a field-effect transistor), such as one of the select transistors $212_0$ to $212_M$ (e.g., that may be drain select transistors, commonly referred to as select gate drain). Select transistors $210_0$ to $210_M$ might be commonly coupled to a select line 214, such as a source select line, and select transistors $212_0$ to $212_M$ might be commonly coupled to a select line 215, such as a drain select line.

A source of each select transistor 210 might be connected to common source 216. The drain of each select transistor 210 might be connected to the source of a memory cell $208_0$ of the corresponding NAND string 206. For example, the drain of select transistor $210_0$ might be connected to the source of memory cell $208_0$ of the corresponding NAND string $206_0$. Therefore, each select transistor 210 might be configured to selectively couple a corresponding NAND string 206 to common source 216. A control gate of each select transistor 210 might be connected to select line 214.

The drain of each select transistor 212 might be connected to the bit line 204 for the corresponding NAND string 206. For example, the drain of select transistor 2120 might be connected to the bit line $204_0$ for the corresponding NAND string $206_0$. The source of each select transistor 212 might be connected to the drain of a memory cell $208_N$ of the corresponding NAND string 206. For example, the source of select transistor $212_0$ might be connected to the drain of memory cell $208_N$ of the corresponding NAND string $206_0$. Therefore, each select transistor 212 might be configured to selectively couple a corresponding NAND string 206 to a corresponding bit line 204. A control gate of each select transistor 212 might be connected to select line 215.

The memory array in FIG. 3B might be a quasi-two-dimensional memory array and might have a generally planar structure, e.g., where the common source 216, strings 206 and bit lines 204 extend in substantially parallel planes. Alternatively, the memory array in FIG. 3B might be a three-dimensional memory array, e.g., where strings 206 may extend substantially perpendicular to a plane containing the common source 216 and to a plane containing the bit lines 204 that may be substantially parallel to the plane containing the common source 216.

Typical construction of memory cells 208 includes a data-storage structure 234 (e.g., a floating gate, charge trap, etc.) that can be used to determine a data value of the cell (e.g., through changes in threshold voltage), and a control gate 236, as shown in FIG. 3B. Memory cells 208 may further have a defined source 230 and a defined drain 232. Memory cells 208 have their control gates 236 coupled to (and in some cases form) a word line 202.

A column of the memory cells 208 is a NAND string 206 or a plurality of NAND strings 206 coupled to a given bit line 204. A row of the memory cells 208 are memory cells 208 commonly coupled to a given word line 202. A row of memory cells 208 can, but need not include all memory cells 208 commonly coupled to a given word line 202. Rows of memory cells 208 may often be divided into one or more groups of physical pages of memory cells 208, and physical pages of memory cells 208 often include every other memory cell 208 commonly coupled to a given word line 202. For example, memory cells 208 commonly coupled to word line $202_N$ and selectively coupled to even bit lines 204 (e.g., bit lines $204_0$, $204_2$, $204_4$, etc.) may be one physical page of memory cells 208 (e.g., even memory cells) while memory cells 208 commonly coupled to word line $202_N$ and selectively coupled to odd bit lines 204 (e.g., bit lines $204_1$, $204_3$, $204_5$, etc.) may be another physical page of memory cells 208 (e.g., odd memory cells). Although bit lines $204_3$-$204_5$ are not expressly depicted in FIG. 3B, it is apparent from the figure that the bit lines 204 of the array of memory cells 200A may be numbered consecutively from bit line $204_0$ to bit line $204_M$. Other groupings of memory cells 208 commonly coupled to a given word line 202 may also define a physical page of memory cells 208. For certain memory devices, all memory cells commonly coupled to a given word line might be deemed a physical page. The portion of a physical page (which, in some embodiments, could still be the entire row) that is read during a single read operation or programmed during a program operation (e.g., an upper or lower page memory cells) might be deemed a logical page.

Figure 3C:
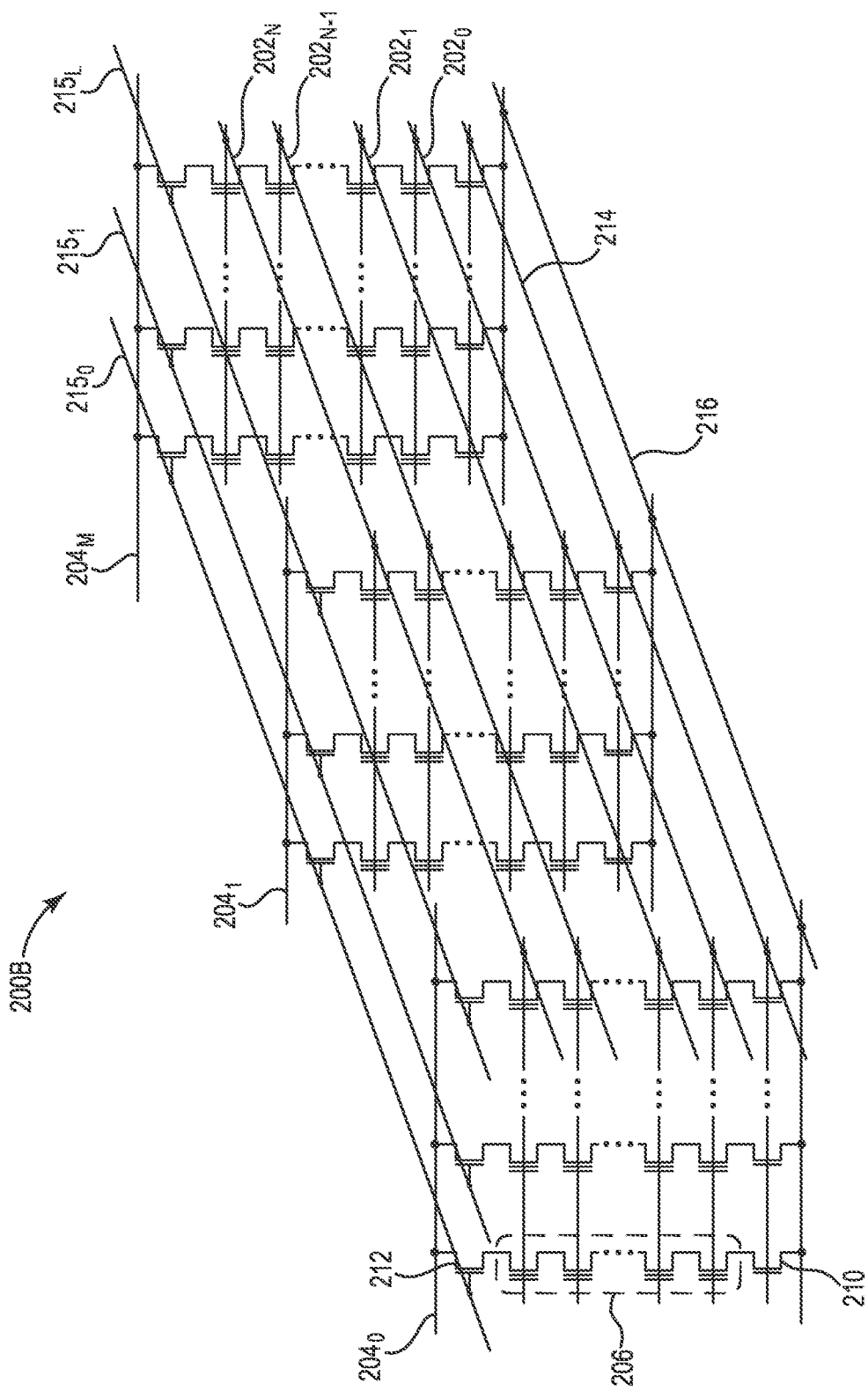

FIG. 3C is another schematic of a portion of an array of memory cells 200B as could be used in a memory of the type described with reference to FIG. 3A, e.g., as a portion of array of the memory array 360. Like numbered elements in FIG. 3C correspond to the description as provided with respect to FIG. 3B. FIG. 3C provides additional detail of one example of a three-dimensional NAND memory array structure. The three-dimensional NAND memory array 200B may incorporate vertical structures which may include semiconductor pillars where a portion of a pillar may act as a channel region of the memory cells of NAND strings 206. The NAND strings 206 may be each selectively connected to a bit line $204_0$ to $204_M$ by a select transistor 212 (e.g., that may be drain select transistors, commonly referred to as select gate drain) and to a common source 216 by a select transistor 210 (e.g., that may be source select transistors, commonly referred to as select gate source). Multiple NAND strings 206 might be selectively connected to the same bit line 204. Subsets of NAND strings 206 can be connected to their respective bit lines 204 by biasing the select lines $215_0$ to $215_L$ to selectively activate particular select transistors 212 each between a NAND string 206 and a bit line 204. The select transistors 210 can be activated by biasing the select line 214. Each word line 202 may be connected to multiple rows of memory cells of the memory array 200B. Rows of memory cells that are commonly connected to each other by a particular word line 202 may collectively be referred to as tiers.

Figure 3D:
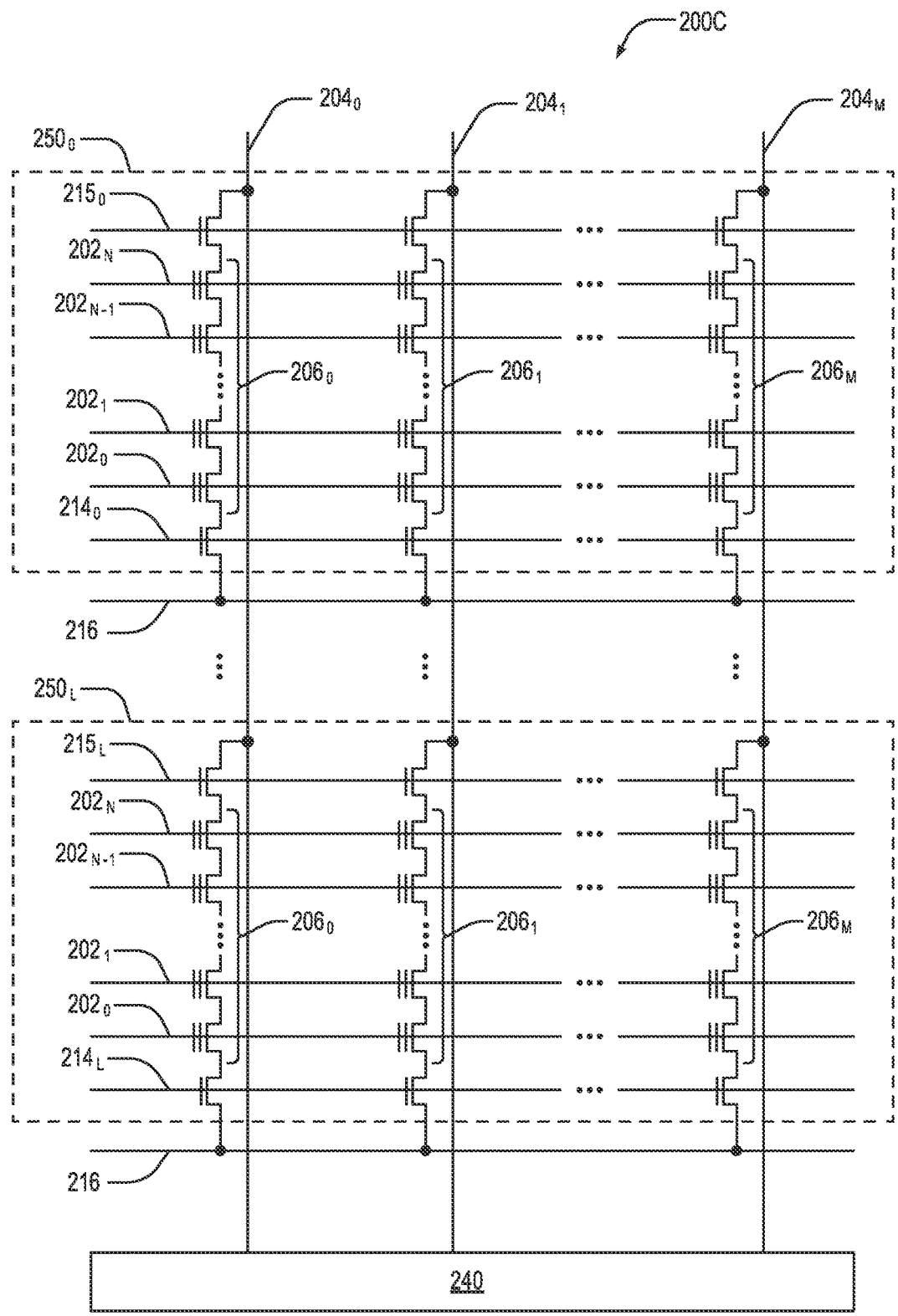

FIG. 3D is a further schematic of a portion of an array of memory cells 200C as could be used in a memory of the type described with reference to FIG. 3A, e.g., as a portion of array of the memory array 360. Like numbered elements in FIG. 3D correspond to the description as provided with respect to FIG. 3B. Array of memory cells 200C may include strings of series-connected memory cells (e.g., NAND strings) 206, access (e.g., word) lines 202, data (e.g., bit) lines 204, select lines 214 (e.g., source select lines), select lines 215 (e.g., drain select lines) and source 216 as depicted in FIG. 3B. A portion of the array of memory cells 200A may be a portion of the array of memory cells 200C, for example. FIG. 3D depicts groupings of NAND strings 206 into blocks of memory cells 250. Blocks of memory cells 250 may be groupings of memory cells 208 that may be erased together in a single erase operation, sometimes referred to as erase blocks. Each block of memory cells 250 might represent those NAND strings 206 commonly associated with a single select line 215, e.g., select line $215_0$. The source 216 for the block of memory cells $250_0$ might be a same source as the source 216 for the block of memory cells $250_L$. For example, each block of memory cells $250_0$-$250_L$ might be commonly selectively connected to the source 216. Access lines 202 and select lines 214 and 215 of one block of memory cells 250 may have no direct connection to access lines 202 and select lines 214 and 215, respectively, of any other block of memory cells 250.

The data lines $204_0$ to $204_M$ may be connected (e.g., selectively connected) to a buffer portion 240, which might be a portion of a page buffer of the memory. The buffer portion 240 might correspond to a memory plane (e.g., the set of blocks of memory cells $250_0$ to $250_L$). The buffer portion 240 might include sensing devices (not shown) for sensing data values indicated on respective data lines 204, and corresponding registers (not shown) for storage of the sensed data values from its corresponding memory plane.

Figure 4:
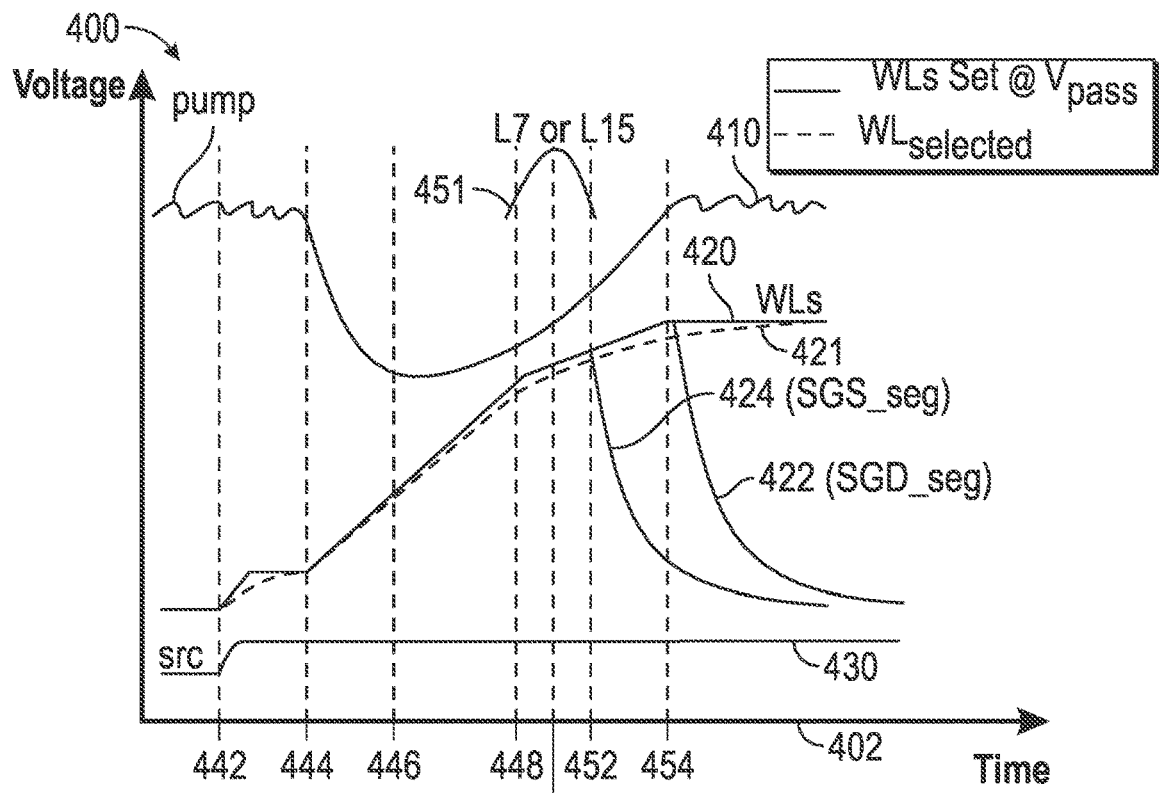
FIG. 4 is a timing diagram showing various voltages associated with memory control signals (pass voltage and wordline read-verify voltage) calibration, illustrating natural slew-rate conditions, according to embodiments of the disclosed technology.

FIG. 4 illustrates voltage waveforms and natural slew-rate characteristics of an exemplary coarse calibration phase for on-chip Vpassr/Vwlry calibration, according to embodiments of the disclosed technology. Specifically, FIG. 4 is a diagram 400 illustrating changes to the voltage of a wordline (WLs) and associated signals, over time, as the wordline transitions up to a target voltage or read voltage, e.g., pass voltage (VpassR) or wordline read-verify voltage (Vwlrv). FIG. 4 depicts the pass voltage (VpassR) 420 applied, the wordline voltage 421, an associated charge pump voltage 410, and a source voltage 430. Referring to FIG. 4, at 442, the wordlines (WLs) and select gate SG are set to Vcc, the source (src) 430 is set to an analog 'on' level, and the bitline (BL) is set to a clamp voltage, BLclamp. At 444, the wordlines (WLs) and select gates SG are set to the pass voltage, VpassR, and the wordline voltage begins increasing. At 446, the select gates SG turn on as their applied voltage V(SG) rises above the sum of the analog source voltage V(src_analog) and the threshold voltage, Vth. Here, a large majority of the X-path capacitance (e.g., the capacitance of the direct or X-path associated with linear regulator output voltage used as proxy) is still hidden due to non-conductive strings (e.g., assuming data randomization, all strings may contain some L15 (in 4 bit per cell) or L7 (in 3 bit per cell) cells, which require the wordlines to exceed the VpassR voltage for strings to conduct and X-path capacitance to be fully visible). (Here, the L15 and L7 refer to the highest distribution levels for the 16-level and 8-level multi-level memories, respectively.)

At time 448 in FIG. 4, VpassR starts intercepting the last $V_T$ distribution. As such, some channels start to see AC ground, and some DC current could potentially flow from the bitline to the source, for example. At time 450, the distribution reaches its peak, e.g., as also shown at 451. Transition then continues, at 452, into the distribution tail, where effectively full current is flowing now that essentially all channels are on, except for a few outlier channels which are ignored. Starting at this point, then, the SGS (select gate source) segmentation (cut-off) can begin to occur, at 424, and also the SGD (select gate drain) segmentation (cut-off) can begin to occur, at 422, if desired. Also, the selected wordline, selWL, can begin to reach a read level, if desired. Finally, at time 454, the wordline voltages level out and achieve flattop.

Figure 5:
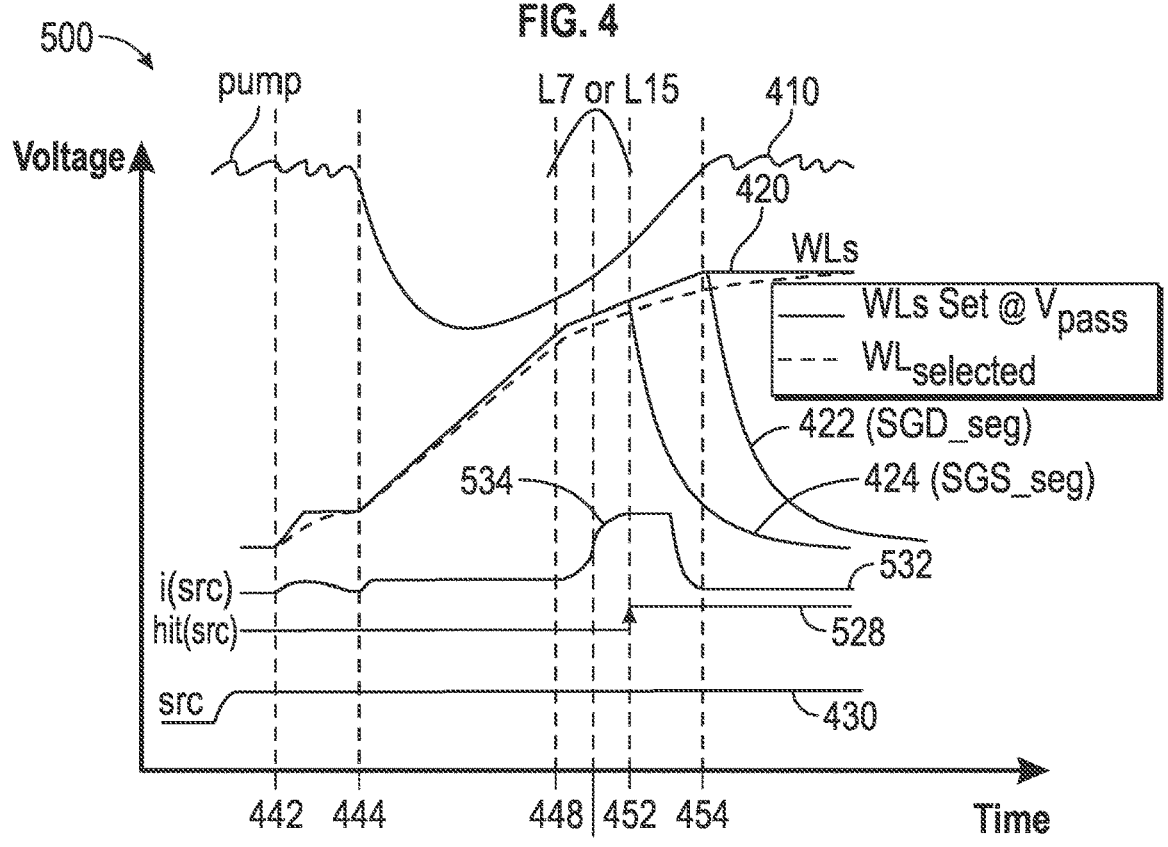
FIG. 5 is a timing diagram showing various voltages associated with read control voltage calibration, illustrating aspects of calibration, according to embodiments of the disclosed technology.

FIG. 5 illustrates additional waveforms and principles regarding the exemplary coarse calibration of FIG. 4, according to embodiments of the disclosed technology. FIG. 5 is a timing diagram 500 showing the same wordline voltage 420 and associated voltage waveforms 410,422,424, 430 depicted in FIG. 4 as well as a signal for the source current being absorbed 532 and a hit (or detection) signal 528 triggered when the injected source current signal reaches a threshold. Referring to the additional details associated with FIG. 5, at time 444, the source (src) is set to a read analog level. As Vpassr starts intercepting the last programmed distribution, at 448, the current injected to the source 532 (wordline AC current+bitline DC current) starts to rise. When the distribution hits its peak, at 450, the current injected to the source 532 has its maximum first derivative. Finally, during the distribution tail, e.g., from 450 to 454, the current injected to the source is rolling-off and saturates. Such roll-off behavior, at 534, will exist across corners, dice (different dies), temperature and other such parameters that typically skew calibration attempts of this nature. Again, details regarding detection and use of this roll-off behavior are set forth in U.S. application Ser. No. 16/424,448, filed May 28, 2019, issued as U.S. Pat. No. 10,741,260 on Aug. 11, 2020, which is incorporated herein by reference in entirety. With regard to incorporating such embodiments, a detector may be built into the source (src) regulator to measure and capture this roll-off behavior. Further, as a hit signal goes high, the measured roll-off information is utilized to segment (cut-off) the source and drain select transistors SGS and SGD, re-bias selected wordline (selWL) level(s) as needed, and work backwards to determine the Vpassr voltage level to be used in the upcoming calibration. Calibration involves estimating the amount the last distribution shifted due to charge loss; and utilizing this information to "calibrate" to a correspondingly lower level both the selected wordline read levels, as well as the unselected wordline VpassR level.

Figure 6:
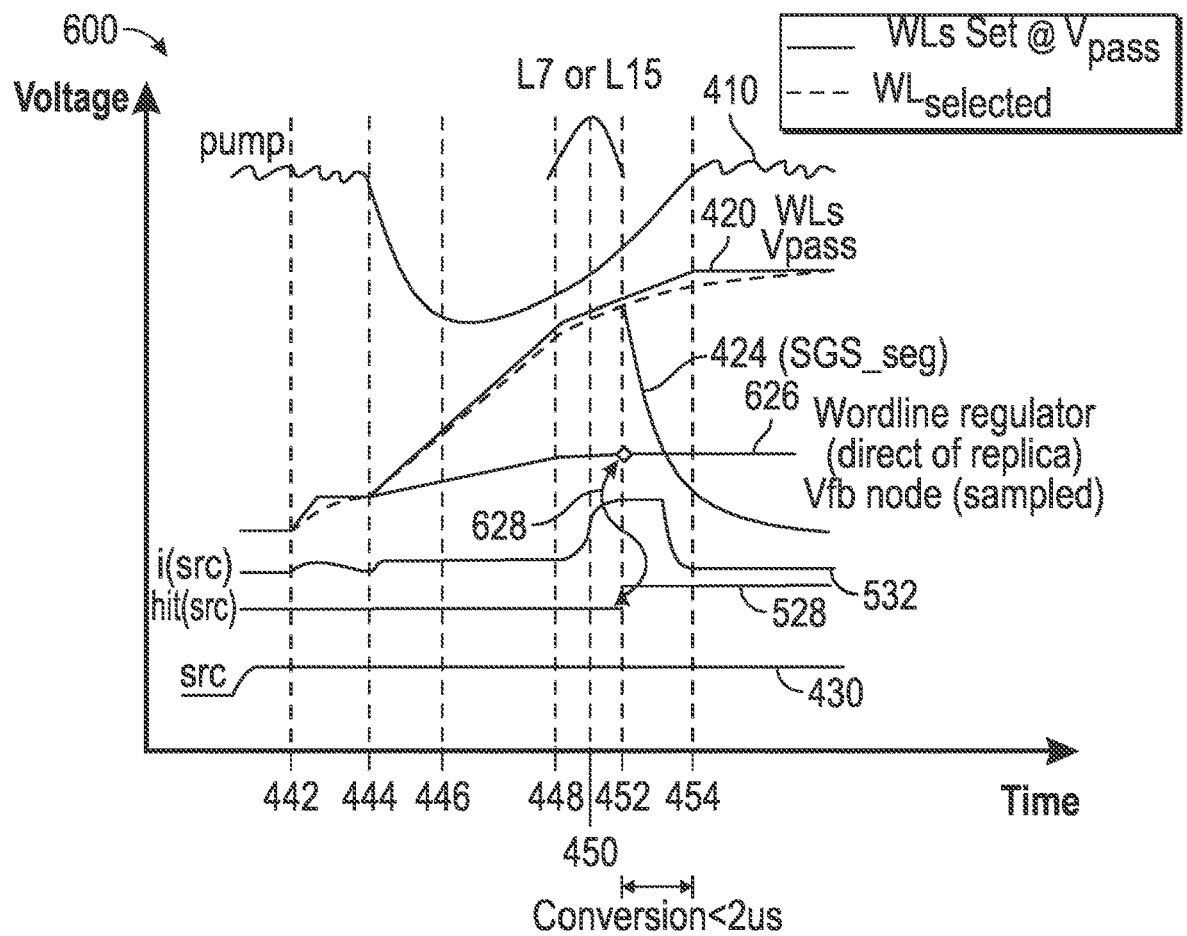
FIG. 6 is a timing diagram showing various voltages associated with read control voltage calibration, illustrating aspects of dynamic (on-the-fly) calibration, according to embodiments of the disclosed technology.

FIG. 6 illustrates additional, dynamic (on-the-fly) aspects of the calibration shown and described in connection with FIGS. 4-5, according to embodiments of the disclosed technology. FIG. 6 is a timing diagram 600 similar to those depicted in FIGS. 4-5, further including a voltage waveform corresponding to a wordline regulator, replica or feedback signal 626 on a node, such as a signal on an internal analog feedback node, which may be utilized as a proxy for the local wordline voltage to determine a wordline voltage level (value) used for calibration. The node 626 used to determine the wordline voltage may directly correspond to or mirror the wordline, or it may be a downscaled replica. In some embodiments, for example, such a node may be provided by a resistive ladder built as a replica of the resistive ladder used by a row driver regulator which biases the wordlines, it would have the same gain or a different gain as the regulator, and it may be implemented with smaller resistance leveraging the benefits of reduced AC effects. In one implementation, the node may be the output of the X-path linear regulator. Here, for example, an appropriate internal measure, such as L7 or L15 level detection, is done during increase of the pass voltage Vpassr by tracking the X-path linear output voltage as proxy for the wordline voltage. In some embodiments, the signal generated may be converted to digital code in the background before being needed, as explained below. Use of such node provides a reliable proxy for the beginning of the local wordline voltage. According to certain aspects, such as embodiments consistent with the representative circuitry and graph of FIGS. 7A-7B, the node 626 follows the output signal (level), divided by the gain of the resistive ladder.

Figure 7A:
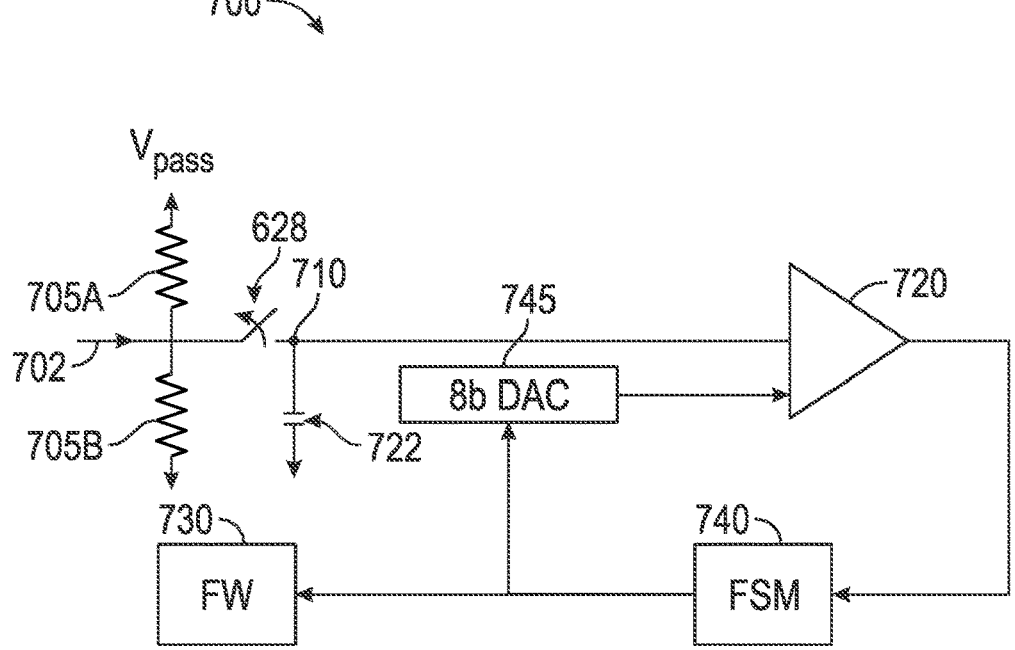
FIG. 7A is a diagram of representative logic and/or circuitry associated with the implementation of FIG. 6, according to embodiments of the disclosed technology.

FIG. 7A is a diagram of representative logic and/or circuitry that may be associated with the signal 626 described in FIG. 6, according to embodiments of the disclosed technology. FIG. 7A illustrates a node 710, such as the feedback node depicted here, coupled to the output 702 via a switch 628 that represents the hit signal 528 triggered when the injected source current saturates. The hit signal 528 may trigger sample and hold activity of the feedback node 710 by suitable means, such as via a local holding thin oxide capacitance, at 722. In the illustrative logic of FIG. 7A, the node 710 is shown following the output 702 divided by a gain, with gain represented via illustrative resistances 705A,705B, here. According to specific circuit embodiments consistent with the disclosed technology, such a node may be configured to provide an output in the range of 0-1.4 volts. According to the embodiment shown, the signal 626 present on such node 710 may be provided to circuitry 720, such as a comparator, which may optionally be autozeroed (AZ comparator), as part of a feedback loop used to optimize the calibration. In one implementation, the feedback loop may comprise a FSM (finite state machine) 740, and an DAC (digital-to-analog converter) circuitry 745. The FSM may provide a digital code to the DAC by suitable algorithm and use the comparator output to identify when the digital code is an accurate digital representation of the sampled voltage 710. Such determined digital code may be provided to a control component 730, such as firmware. Here, for example, the firmware may be configured to process digitally-sampled information to correct the coarse wordline read-verify voltage before settling to its first level. Such implementation has the benefit of avoiding read time (tR) impact and program time (tProg) impact.

Figure 7B:
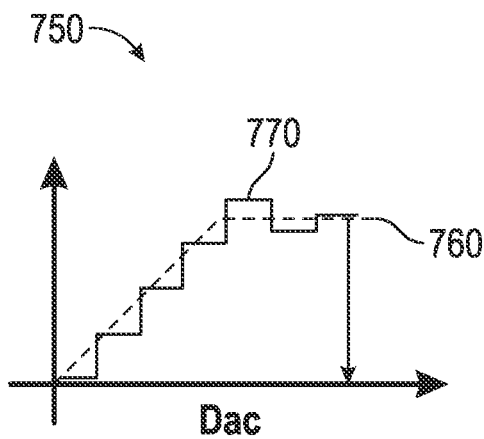
FIG. 7B is a graph illustrating circuit response behavior of the logic and/or circuitry of FIG. 7A, according to embodiments of the disclosed technology.

With regard to the feedback illustrated in FIG. 7A, an output of the first circuitry 740 of the feedback loop may be processed with data from the control circuitry in providing suitable feedback to the comparator, at 720. If the feedback is generated as 8-bit digital code by a finite state machine 740, for example, the code may be converted via an 8-bit DAC (digital-to-analog converter), at 745, and provided as input to the comparator, at 720. In one specific example, such circuitry may be implemented with a binary search machine, e.g., a O(log 256)*120 ns<2 μs machine, wherein O( ) stands for the big O notation. Such a machine may be operating in tracking mode while the wordline voltages were increasing. Here, since we know this machine operates with highly deterministic behavior with respect to increase and holding, knowledge of this behavior may be leveraged to provide accurate values for the wordline voltage retroactively when the node 710 is sampled in such a manner. FIG. 7B is a graph 750 illustrating how the behavior of a sampled signal 770 on the node 710 can be accurately correlated to the corresponding wordline voltage of interest 760. After correct calibration, the unselected wordlines are biased to the calibrated pass voltage (VpassR) value, and the selected wordline is biased to the calibrated wordline read-verify (Vwlrv) value. The charge pump voltage, however, may or may not be updated as a result of the calibration.

Figure 8:
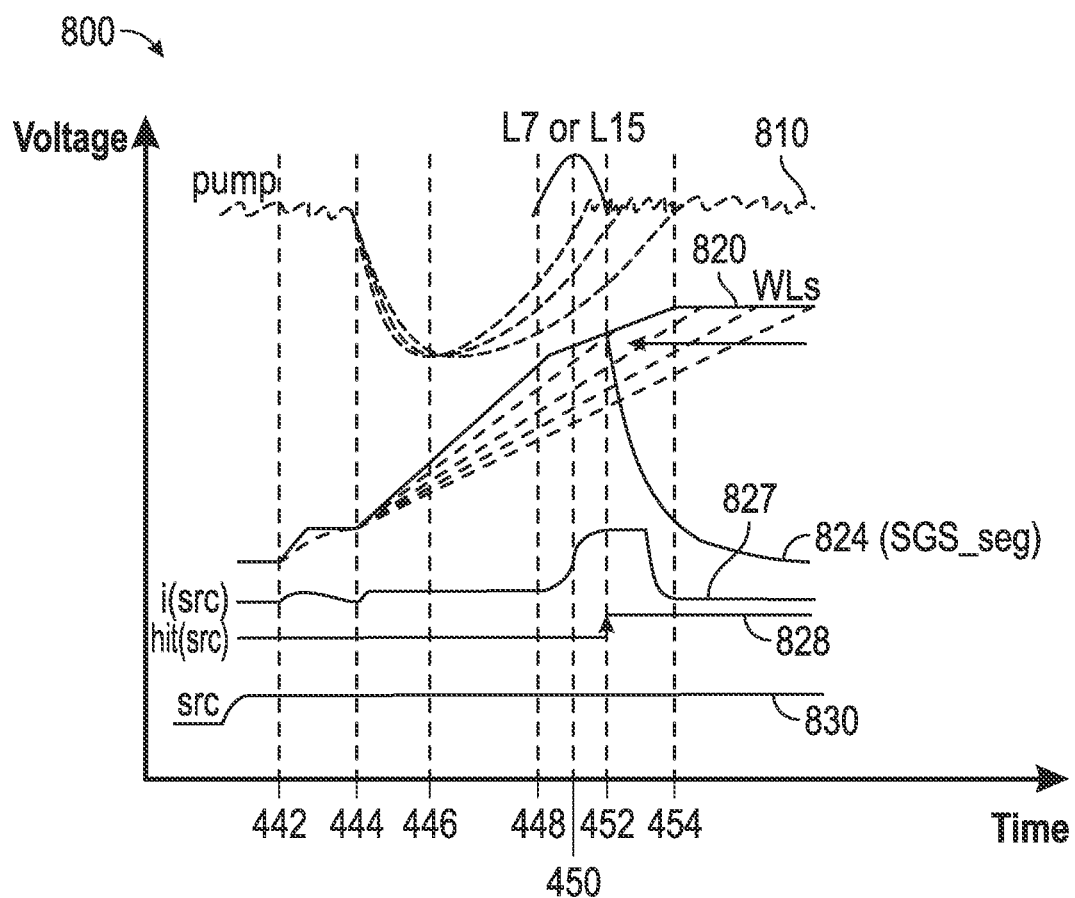
FIG. 8 illustrates various waveforms associated with an alternative implementation for calibrating read control voltages, according to embodiments of the disclosed technology.

FIG. 8 illustrates various waveforms associated with an alternative implementation for calibrating read control voltage, according to embodiments of the disclosed technology. As with FIGS. 5 and 6, FIG. 8 depicts wordline voltage 820, charge pump signals 810, current absorbed by source i(src) 827, hit signal 828, and source voltage 830. Referring to FIG. 8, at time 444, when the wordlines and select gates are set to the pass voltage, the source (src) is set to read analog level. Here, then, to determine an estimate for the wordline voltage corresponding to the last Vt distribution, the firmware can directly staircase the wordline voltage by operating on the generic analog circuitry at its disposal. Further, in some embodiments, the slew-rate is selectable as a fuse option in the circuitry. This approach is simple and direct, and multiple slopes or ramps may be tried, e.g., at 822A, 822B, 822C, 822D. In this embodiment, however, the fastest slope (natural slope) may not be achieved due to parasitic resistance of the row decoder path as well as firmware limitation of being used exclusively for this task, forcing the selection of a higher slew-rate option that may impact the performance of the device (tR and tProg).

In detecting or determining the pass voltage to use in calibration, the firmware may start from the slowest slew-rate, then proceed through faster ones. Such embodiments will yield an iterative determination of the pass voltage sought, which can be seen on silicon, and flag a deviation in the detected signal indicating the pass voltage level used in calibration.

Figure 9:
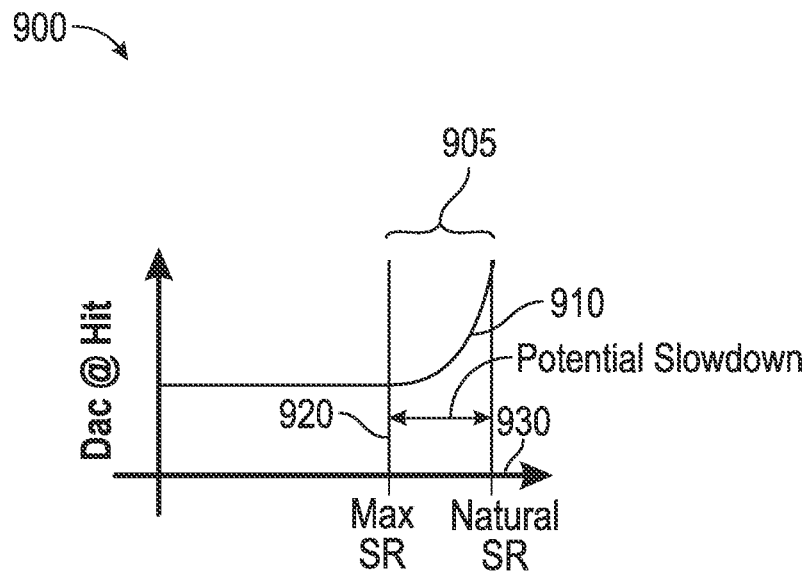
FIG. 9 is a graph illustrating how differences in wordline ramp-up (increasing) slew rate (SR) can affect the detected voltage of the charge loss impacted upper distribution (L7 or L15), according to embodiments of the disclosed technology.

FIG. 9 is a graph 900 illustrating how difference in slew rate (SR) along the horizontal X-axis may affect the determined calibration voltage at the condition of detection, according to embodiments of the disclosed technology. The range 905 of slew rate, e.g. from a maximum slew rate 920 up to a natural slew rate 930, is dictated by charge pump characteristics and parasitic circuit parameters, not by the construction or behavior of the firmware or memory cells. The curve 910 shown in FIG. 9 illustrates the effect on the performance of the detected voltage (identified by DAC at the time of the hit signal) as the slew rate progresses from a max achievable value, at 920, up to a faster rate, such as the natural slew rate 930.

Figure 10:
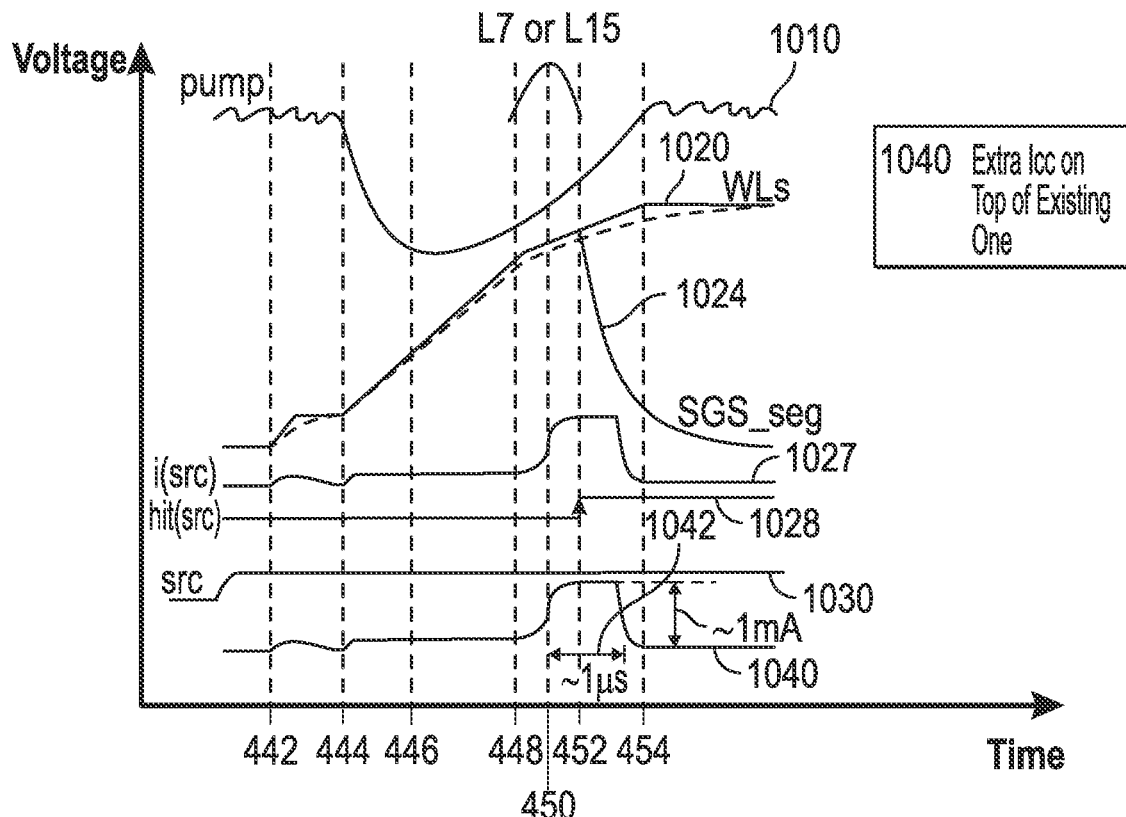
FIG. 10 illustrates various waveforms associated with calibrating read control voltages, including aspects related to the effect on memory device current (Icc), according to embodiments of the disclosed technology.

FIG. 10 is a graph showing similar wordline voltage and associated signals as in the earlier figures while including an additional current waveform 1040 that illustrates further aspects of the innovations herein, according to embodiments of the disclosed technology. Here, this helps illustrate how the current levels required, and hence any associated impact on the device current (Icc), are minimal in achieving the present innovations. As with FIGS. 5, 6 and 8, FIG. 10 depicts wordline voltage 1020, charge pump voltage 1010, current absorbed by source i(src) 1027 as well as the hit signal 1028 and source voltage 1030. Referring to FIG. 10, a current waveform 1040 reflecting the current from the bitline to source is shown in relation to the associated signal discussed above. This current is needed for reliable detection, since the AC (capacitive current) component of the wordline current is not reliable (here, e.g., the presence of a 3σ [3-sigma] L15 cell close to the bitline or source side may impact this current component and skew reliability). The magnitude of such a current signal, however, need not be too high. In some embodiments, for example, the magnitude of such a current measure may be about 1 mA, or less. Moreover, in related embodiments, systems and methods herein can limit conduction during detection to a section of the page (i.e. to the first 2 KB close to the string driver, out of the total page size of 16 KB in some embodiments). This reduces current consumption and mitigates error from conduction of far pillars or strings impacted by wordline RC (resistive-capacitive) factors. Using illustrative numerical parameters consistent with the representative operation shown in FIG. 10 and associated circuitry, limiting conduction to the first 2 KB at 50 nA/string would yield a current of 820 μA per plane. In other words, systems herein may be implemented at less than 1 mA over a time delta, dt, given by Vt distribution width/slew rate, specifically, in this circuit example, 0.6 v/(8 v/10 μs), or 0.68 μs, i.e., less than one microsecond. Further, shortly after the hit signal triggers, this current can be cut. As such, an associated average Icc across for example 4 planes, even at 1 mA per plane, given a contribution of 1 µs/35 µs (assuming the overall read time tR to be 35 us), yields an average Icc of about 120 µA. Accordingly, such current levels are within acceptable Icc range targeted by modern 3D NAND devices for read and program operations (which can be in the range of 30 mA, on average).

The subject matter disclosed above may also be embodied in a variety of different forms and, therefore, subject matter covered or claimed herein is intended to be construed as not being limited to any example embodiments set forth above, i.e., such example embodiments are provided merely to be illustrative. Likewise, a reasonably broad scope for claimed or covered subject matter is intended. Among other things, for example, subject matter may be embodied as methods, devices, components, or systems. Accordingly, embodiments may, for example, take the form of hardware, software, firmware or any combination thereof (other than software per se). The following detailed description is, therefore, not intended to be taken in a limiting sense.

Throughout the specification and claims, terms may have nuanced meanings suggested or implied in context beyond an explicitly stated meaning. Likewise, the phrase "in one embodiment" as used herein does not necessarily refer to the same embodiment and the phrase "in another embodiment" as used herein does not necessarily refer to a different embodiment. It is intended, for example, that claimed subject matter include combinations of example embodiments in whole or in part.

In general, terminology may be understood at least in part from usage in context. For example, terms, such as "and", "or", or "and/or," as used herein may include a variety of meanings that may depend at least in part upon the context in which such terms are used. Typically, "or" if used to associate a list, such as A, B or C, is intended to mean A, B, and C, here used in the inclusive sense, as well as A, B or C, here used in the exclusive sense. In addition, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

Those skilled in the art will recognize that the methods and devices of the present disclosure may be implemented in many manners and as such are not to be limited by the foregoing exemplary embodiments and examples. In other words, aspects/elements can be performed by single or multiple components, in various combinations and/or sub-combinations, and individual aspects, may be distributed among components and/or subcomponents. In this regard, any number of the features of the different embodiments described herein may be combined into single or multiple embodiments, and alternate embodiments having fewer than, or more than, all the features described herein are possible.

While various embodiments have been described for purposes of this disclosure, such embodiments should not be deemed to limit the teaching of this disclosure to those embodiments. Various changes and modifications may be made to the elements and features described above to obtain a result that remains within the scope of the systems and processes described in this disclosure.

The invention claimed is:

1. A memory system comprising:
   a multi-level memory array including:
      a plurality of memory cells;
      wordlines coupled to the plurality of memory cells;
      one or more regulators including one or both of a first regulator coupled to a selected wordline and a second regulator coupled to a set of the wordlines that are unselected;
      one or more charge pumps coupled to the one or more regulators and configured to generate a control voltage onto the wordlines;
   control circuitry coupled to the memory array, the control circuitry including:
      feedback circuitry coupled to the one or more regulators and configured to calibrate the control voltage provided to the wordlines as a function of memory cell performance or wordline output; and
      a node having a proxy signal that is a representation of the control voltage on to the wordlines;
      wherein the proxy signal is provided as feedback to calibrate the control voltage.

2. The system of claim 1 wherein the control circuitry includes a wordline regulator having an output that corresponds to the node, wherein an output voltage of the wordline regulator is used as the proxy signal.

3. The system of claim 2 wherein the wordline regulator is a linear regulator.

4. The system of claim 2 wherein the wordline regulator is used to provide a reference voltage in an X-path or row decoder of the memory array.

5. The system of claim 1 wherein the control circuitry further comprises a control component that is coupled to the feedback circuitry, wherein the control component is electrically connected and used to set or correct a calibration level.

6. The system of claim 5 wherein the control component comprises firmware, the firmware being used to set or correct the calibration level.

7. The system of claim 1, wherein the feedback circuitry includes components electrically coupled to convert between at least one of analog and digital signals and digital and analog signals, as part of the calibration.

8. The system of claim 1, wherein the feedback circuitry further includes a comparator or an autozeroed comparator coupled to the node to receive and process the proxy signal via the feedback circuitry, such that the control circuitry provides a calibration signal to adjust the voltages generated by the regulators responsive to the proxy signal.

9. The system of claim 1, wherein the feedback circuitry further includes first circuitry that converts the proxy signal into a digital signal for digital processing via the feedback circuitry.

10. The system of claim 9 wherein the first circuitry comprises a finite state machine.

11. The system of claim 10, wherein the finite state machine is configured to operate on N-bit analog-to-digital or digital-to-analog systems.

12. The system of claim 9, wherein the feedback circuitry further includes a digital-to-analog converter coupled to the output of the first circuitry, wherein the digital-to-analog converter converts the digital signal to an analog signal for provision back into the feedback circuitry, to provide a detection for an adjusted calibration signal.

13. The system of claim 12 wherein the first circuitry comprises a finite state machine.

14. The system of claim 1 wherein the multi-level memory array comprises a NAND memory array.

15. A memory system comprising:
a multi-level memory array including:
a plurality of memory cells;
wordlines coupled to the plurality of memory cells;
one or more regulators including one or both of a first regulator coupled to a selected wordline and a second regulator coupled to a set of the wordlines that are unselected;
one or more charge pumps coupled to the one or more regulators and configured to generate a control voltage onto the wordlines;
control circuitry coupled to the memory array, the control circuitry including:
feedback circuitry coupled to the one or more regulators and configured to calibrate the control voltage provided to the wordlines as a function of memory cell performance or wordline output; and
a node having a proxy signal that represents voltage on the wordlines throughout ramp up that occurs while the control voltage increases during charging by the one or more charge pumps;
wherein calibration is performed during the ramp up as a function of using the proxy signal of the node to calibrate the control voltage.

16. The system of claim 15 wherein the control circuitry includes a wordline regulator having an output that corresponds to the node, wherein an output voltage of the wordline regulator is used as the proxy signal.

17. The system of claim 16 wherein the wordline regulator is a linear regulator.

18. The system of claim 16 wherein the wordline regulator is used to provide a reference voltage in an X-path or row decoder of the memory array.

19. The system of claim 15 wherein the control circuitry further comprises a control component that is coupled to the feedback circuitry, wherein the control component is electrically connected and used to set or correct a calibration level.

20. The system of claim 19 wherein the control component comprises firmware, the firmware being used to set or correct the calibration level.

21. The system of claim 15, wherein the feedback circuitry includes components electrically coupled to convert between at least one of analog and digital signals and digital and analog signals, as part of the calibration.

22. The system of claim 15, wherein the feedback circuitry further includes a comparator or an autozeroed comparator coupled to the node to receive and process the proxy signal via the feedback circuitry, such that the control circuitry provides a calibration signal to adjust the voltages generated by the regulators responsive to the proxy signal.

23. The system of claim 15, wherein the feedback circuitry further includes first circuitry that converts the proxy signal into a digital signal for digital processing via the feedback circuitry.

24. The system of claim 23 wherein the first circuitry comprises a finite state machine.

25. The system of claim 24, wherein the finite state machine is configured to operate on N-bit analog-to-digital or digital-to-analog systems.

26. The system of claim 23, wherein the feedback circuitry further includes a digital-to-analog converter coupled to the output of the first circuitry, wherein the digital-to-analog converter converts the digital signal to an analog signal for provision back into the feedback circuitry, to provide a detection for an adjusted calibration signal.

27. The system of claim 26 wherein the first circuitry comprises a finite state machine.

28. The system of claim 15 wherein the multi-level memory array comprises a NAND memory array.

29. A memory system comprising:
a multi-level memory array including:
a plurality of memory cells;
wordlines coupled to the plurality of memory cells;
one or more regulators including one or both of a first regulator coupled to a selected wordline and a second regulator coupled to a set of the wordlines that are unselected;
one or more charge pumps coupled to the one or more regulators and configured to generate a control voltage onto the wordlines;
control circuitry coupled to the memory array, the control circuitry including:
feedback circuitry coupled to the one or more regulators and configured to calibrate the control voltage provided to the wordlines as a function of memory cell performance or wordline output; and
a node having a proxy signal that is a representation of a voltage signal generated on the wordlines by the control voltage;
wherein calibration is performed as a function using the proxy signal of the node to calibrate the control voltage, without increasing one or both of read time and program time.

* * * * *